Figure 1:
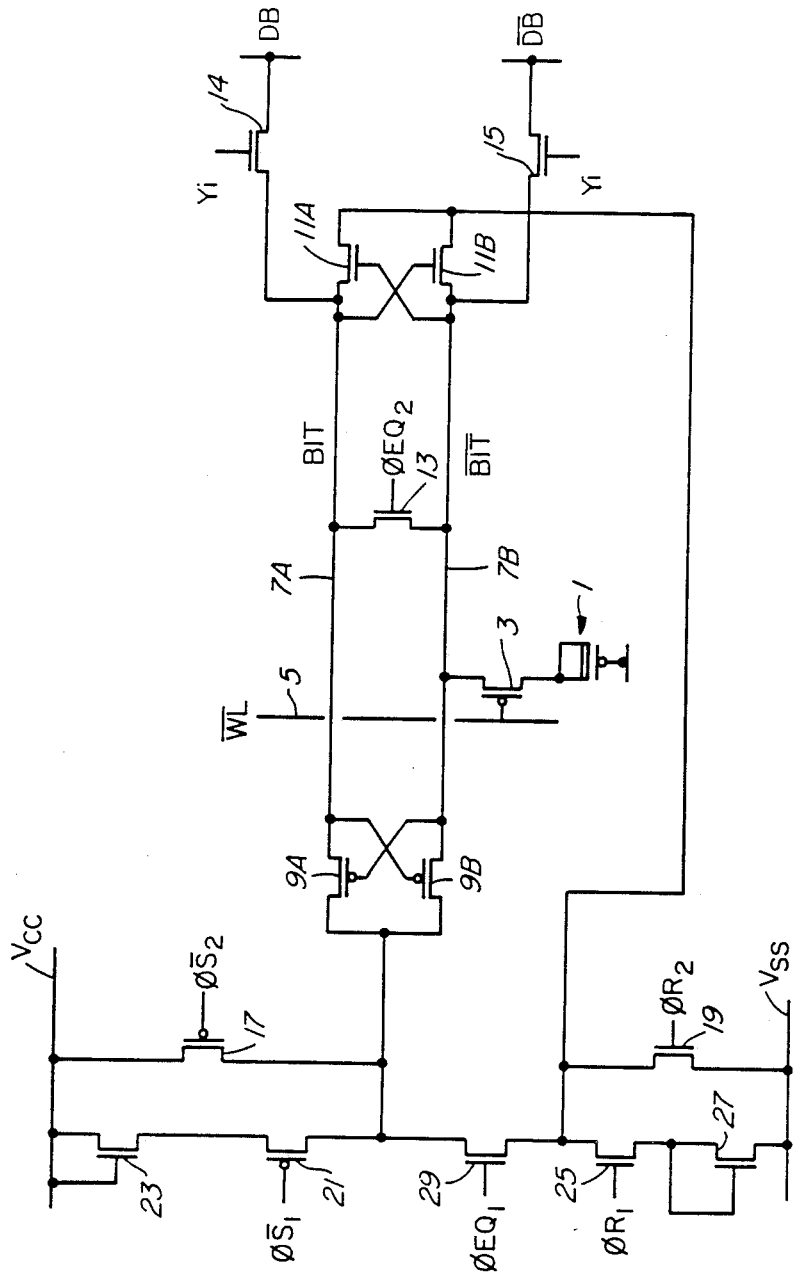

United States Patent [19]

Foss

[11] Patent Number: 4,980,862
[45] Date of Patent: Dec. 25, 1990

[54] FOLDED BITLINE DYNAMIC RAM WITH REDUCED SHARED SUPPLY VOLTAGES

[75] Inventor: Richard C. Foss, Calabogie, Canada

[73] Assignee: Mosaid, Inc., Canada

[21] Appl. No.: 268,590

[22] Filed: Nov. 8, 1988

[30] Foreign Application Priority Data

Nov. 10, 1987 [CA] Canada .................................. 551518

[51] Int. Cl.$^5$ ......................... G11C 7/00; G11C 11/24
[52] U.S. Cl. .................................... 365/203; 365/149; 365/208; 365/222
[58] Field of Search ............... 365/203, 205, 208, 222, 365/149

[56] References Cited

U.S. PATENT DOCUMENTS 4,780,850 10/1988 Miyamoto et al. ................. 365/203

Primary Examiner—James W. Moffitt
Attorney, Agent, or Firm—Laff, Whitesel, Conte & Saret

[57] ABSTRACT

A folded bitline dynamic RAM circuit with reduced shared supply voltages comprised of circuitry for applying full logic high and low supply voltages to respective bitlines during successive active cycles of the RAM circuit, and circuitry for applying reduced supply voltages to the bitlines during successive precharge cycles. By applying reduced supply voltages to the bitlines during the precharge cycles voltage stress on cell access transistors and sense amplifiers of the RAM circuit are reduced. The time required to share the charge residing on the bitline halves at the start of the active cycle is also reduced.

9 Claims, 2 Drawing Sheets

FOLDED BITLINE DYNAMIC RAM WITH REDUCED SHARED SUPPLY VOLTAGES

This invention relates in general to dynamic random access memories (RAMs), and more particularly to a method and apparatus for applying reduced supply voltages to respective bitlines of a folded bitline dynamic RAM circuit during successive precharge portions of the RAM operating cycle.

Dynamic RAM circuits are well known for capacitively storing charge on a plurality of memory cells, each cell being comprised of a storage capacitor and cell access transistor. Charge stored on the capacitors is transferred to associated bitlines and detected via sense amplifiers or latches connected to the bitlines. Charge is thereafter restored Within the storage capacitOrs via assOciated restore latches.

Recent trends towards electronic miniaturization have resulted in the development of folded bitline dynamic RAM circuits which utilize fewer and smaller components than prior art open bitline designs wherein one bitline was precharged from full logic high to logic low supply voltages. According to the folded bitline approach, the voltage on each bitline moves to an opposite one of the logic high and logic low power rails. Thus, there is less substrate noise than in prior art open bitline designs, due to cancellation of the folded bitline voltage couplings.

It is a well known requirement of dynamic RAM circuits that the stored voltage levels be as high as possible, consistent with available supply voltages and the maximum voltages which can be safely applied to the memory cell. Thus, the effect of voltage stresses on the smaller components used in folded bitline devices is critical. For example, voltage stress across the drain-source path of a transistor may cause punch-through or degradation of the transistor characteristics. Also, voltage stress across the dielectric of a storage capacitor may cause it to rupture.

Therefore, in an effort to minimize the voltage stress on the miniaturized components of present day folded bitline dynamic RAM devices, some manufacturers have begun using a "mid-point reference" configuration. For example, the TC511000/TC511001 1M×1 CMOS DRAM manufactured by Toshiba generates a mid-point reference level on the bitlines by charge sharing logic high and logic low supPly voltages between the bitlines at the end Of the active portion of the operating cycle. Since a period of several milliseconds may elapse before the next active cycle, a potential divider or "maintainer" is utilized to ensure the mid-point reference level does not drift from the level established by bitline charge sharing. In practice, such potential dividers are incapable of accurately maintaining the mid-point reference level, with the result that some differences are usually observed between the reference level existing just after bitline sharing and the reference level detected at the end of the precharge portion of the operating cycle (i.e. just before the next active cycle).

This midpoint level drifting has been found to be undesirable since it results in loss of effective signal margin, and at best requires additional testing with wait states included and/or additional standby power being provided for the potential divider or maintainer. However, the major benefit of the approach taken by Toshiba is that there is reduced voltage stress on the sense amplifier transistors, and there is minimal stress on the cell access transistors during the time the memory is in its quiescent or precharge cycle.

Another prior art CMOS DRAM is the 256K×1 model i51C256 manufactured by INTEL Corporation. According to the INTEL design, the logic high and low bitline supply voltage levels are shared at the start of each active cycle instead of at the end of the active cycle as in the aforementioned Toshiba approach Thus, the requirement for incorporation of a mid-point reference level maintainer is eliminated. However, a principal disadvantage of the INTEL design is that there is increased voltage stress on the sense amplifier and cell access transistors during the precharge cycle since full supply levels are maintained on the bitlines. In practice, the precharge cycle is by far the longer portion of the complete operating cycle. Also, increased time is required over the Toshiba approach in order to share the bitline voltage levels at the start of the active cycle, which generally increases the cell access time since the cell access transistor cannot be activated until charge sharing has been completed.

According to the present invention, a method and apparatus are provided for applying precharge supply voltage levels to the bitlines prior to the active cycle, as in the prior art Toshiba approach. However, these supply voltage levels are substantially reduced from full logic high and logic low levels, and bitline charge sharing is not implemented until the start of the active cycle, as in the prior art INTEL approach. Therefore, the principal advantages of the prior art Toshiba and INTEL approaches are obtained while the prior art disadvantages are overcome. In particular, the reduced voltages applied to the bitlines during the precharge cycle result in fast cell access time and low voltage stress, and bitline sharing at the start of the active cycle reduces mid-point reference level drift such that the requirement for a mid-point reference level maintainer is eliminated.

In general, according to the present invention there is provided a method of accessing and refreshing data stored on one or more storage capacitors connected via corresponding cell access transistors to respective bitlines of a folded bitline dynamic RAM circuit, during successive active and precharge operating cycles thereof. The method comprises the steps of applying reduced high and low supply voltages to respective ones of the bitlines during the precharge cycle, ceasing application of the reduced supply voltages to the bitlines and interconnecting the bitlines at the start of the active cycle, for equalizing charge on the bitlines, and connecting the cell access transistors to the bitlines for transferring data from the storage capacitors to the bitlines, and thereafter sensing the data transferred to the bitlines, whereby the data is accessed. Full high and low supply voltages are then applied to the respective bitlines for restoring the data on the storage capacitors such that the data is refreshed, and the cell access transistors are then disconnected from the bitlines at the end of the active cycle.

In accordance with the present invention there is also provided a modified folded bitline dynamic RAM circuit comprised of a plurality of memory cells for storing data therein, a plurality of pairs of folded bitlines, circuitry for applying reduced high and low supply voltages to respective ones of the bitline pairs for precharging the bitlines, and thereafter ceasing application of the voltages, circuitry for interconnecting respective bitlines of each of the bitline pairs for equalizing charge thereon, and thereafter disconnecting the respective bitlines, circuitry for connecting the plurality of memory cells to the respective bitlines for transferring the data onto the bitlines, circuitry for sensing the data transferred to the bitlines thereby accessing the data, and circuitry for applying full high and low supply voltages to the respective ones of the bitlines for restoring the data in the memory cells, whereby applying the reduced supply voltages to the bitlines results in reduced voltage stress and quick data access.

Figure 2:
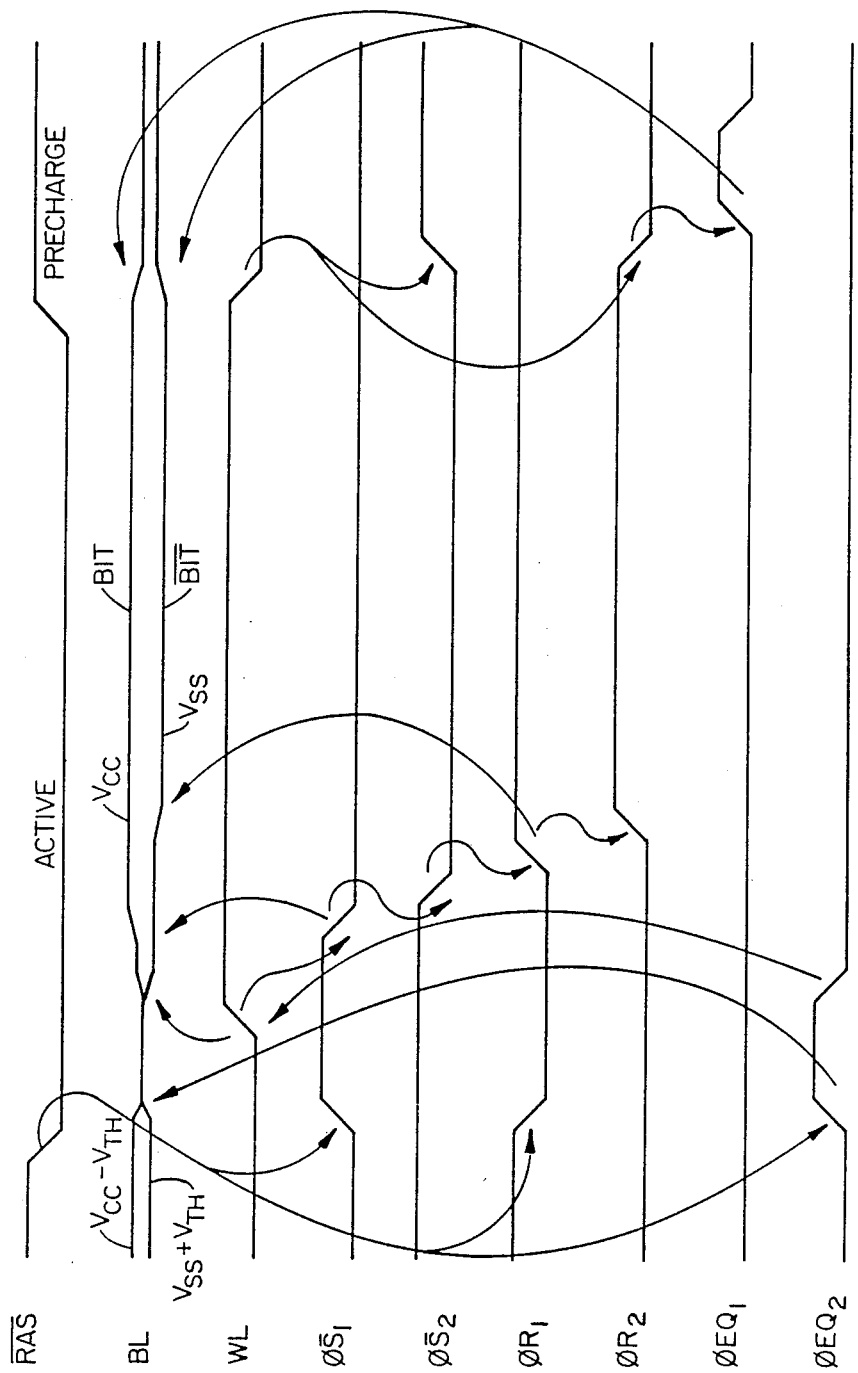

A better understanding of the present invention will be obtained with reference to the detailed description below in conjunction with the following drawings in which:

FIG. 1 is a basic schematic diagram of a folded bitline dynamic RAM circuit with selectable reduced precharge supply voltage levels, in accordance with the present invention, and FIG. 2 is a timing diagram illustrating signals applied to the circuit of FIG. 1 for operating the circuit in accordance with the method of the present invention.

Turning to FIG. 1, a simplified folded bitline dynamic RAM is illustrated having a single P-channel memory cell comprised of a storage capacitor 1 and a cell access transistor 3 having a gate terminal connected to a wordline 5 ($\overline{WL}$). A source terminal of cell access transistor 3 is connected to the first bitline half 7B of a folded bitline pair 7A and 7B (BIT, $\overline{BIT}$).

Although only a single memory cell is shown, typically either 128 or 256 of such cells are connected alternately to the folded bitline pair 7A and 7B, and are activated by respective additional wordlines in a well known manner. For ease of description these additional memory cells are not shown.

The bitline pair 7A and 7B are connected at one end via a P-channel cross-coupled pair of transistors 9A and 9B forming a voltage sense latch or flip-flop, and at the other end via N-channel cross-coupled transistors 11A and 11B forming a voltage restore latch or flip-flop. The bitlines 7A and 7B are also connected together for charge sharing via a further N-channel transistor 13.

As described in greater detail below, during the active cycle of DRAM operation, charge stored on the memory cell is transferred to bitline 7B such that a voltage differential is developed between the bitline pair 7A and 7B. The voltage sense latch (9A and 9B) is enabled to pull the higher voltage one of bitlines 7A or 7B to a full logic high supply voltage ($V_{CC}$) while the N-channel restore latch (11A and 11B) pulls the other one of the bitlines 7A or 7B to a full logic low supply voltage ($V_{SS}$). Further N-channel transistors 14 and 15 are enabled throughout the active cycle ($\overline{RAS}$) by means of coded row address signals $Y_i$, in a well known manner. As a result, the differential charge appearing on bitlines 7A and 7B are applied to respective data bus lines DB and $\overline{DB}$ for reading data from and writing data to the selected memory cell (1 and 3).

However, whereas full logic high ($V_{CC}$) and logic low ($V_{SS}$) supply voltages are applied to the selected bitlines 7A and 7B via the sense latch (9A and 9B) and restore latch (11A and 11B), respectively, during the active cycle, in accordance with the present invention reduced logic high and low supply voltages are maintained on the bitlines 7A and 7B throughout the precharge cycle. This has been found to reduce voltage stress within the circuit and to facilitate quick charge sharing between the bitlines at the start of the active cycle, thereby overcoming the various disadvantages of prior art designs. In order to accomplish this objective, an additional plurality of transistors are connected between the logic high ($V_{CC}$) and logic low ($V_{SS}$) supply voltages and the respective sense and restore latches In particular, source terminals of restore latch transistors 9A and 9B are connected together and to the drain terminal of a P-channel transistor 17 having a source terminal thereof connected to the $V_{CC}$ power source, and the drain terminals of restore latch transistors 11A and 11B are connected together and to the source terminal of an N-channel transistor 19 having a drain terminal thereof connected to the $V_{SS}$ power sink. In operation, enable signals OS2 and OR2 applied to the gate terminals of transistors 17 and 19 respectively, result in full logic high and logic low voltage levels being applied to the sense and restore latches.

Also, a further P-channel transistor 21 is provided with a drain terminal connected to the source terminals of sense latch transistors 9A and 9B, and a source terminal connected to a non-linear load or resistance in the form of a further N-channel transistor 23 which has a drain terminal connected to the source terminal of transistor 21 and gate and source terminals thereof connected together and to the logic high power supply source $V_{CC}$. Likewise, an additional N-channel transistor 25 is provided having a source terminal thereof connected to the drain terminals of restore latch transistors 11A and 11B and a drain terminal thereof connected to a linear load or resistance in the form of a further N-channel transistor 27 which has gate and source terminals connected together and to the drain terminal of transistor 25, and a drain terminal thereof connected to the source of logic low level supply voltage $V_{SS}$.

In response to receiving enable signals $\overline{OS1}$ and OR1 on the gate terminals thereof, transistors 21 and 25 connect the source and drain terminals of the sense and restore latches to the logic high and logic low supply voltage sources through the respective load resistances provided by the drain-source channels of transistors 23 and 25. The voltage drop across the load resistances results in reduced supply voltage levels being applied to the sense and restore latches throughout the precharge operation cycle.

Turning now to the timing diagram of FIG. 2 in conjunction with the circuit of FIG. 1, a single operating cycle of the dynamic RAM circuit is shown comprised of an active portion and a precharge portion which are defined by respective low and high logic levels of the row select ($\overline{RAS}$) signal, in a well known manner.

During the precharge cycle prior to the falling edge of the $\overline{RAS}$ signal, a reduced logic high supply voltage is supplied to bitline 7A via transistors 21, 23 and 9A responsive to a low $\overline{\emptyset S1}$ signal being applied to the gate terminal of transistor 21. A reduced logic low level signal is applied to the bitline 7B through transistors 25, 27 and 11B in response to a logic high level OR1 signal being applied to the gate terminal transistor 25.

Transistors 23 and 27 are configured to operate in current saturation mode such that the reduced logic high and logic low supply voltages applied to the sense and restore latches are $V_{CC} - V_{TH}$ and $V_{SS} + V_{TH}$, respectively, where $V_{TH}$ is the threshold voltage for transistors 23 and 27.

According to a successful prototype of the present invention, $V_{CC}$ and $V_{SS}$ were 5 volts and 0 volts respectively, and the reduced logic high and low supply voltages were 3.8 volts and 0.8 volts respectively.

At the start of the active cycle, the $\overline{RAS}$ signal goes from a logic high to a logic low level. Next, the ØS1 and ØR1 signals go from logic low to logic high and logic high to logic low levels respectively, thereby disabling transistors 21 and 25 and disconnecting the logic high and logic low power supply sources from the bitlines 7A and 7B.

The ØEQ2 signal then goes from a logic low to a logic high level, thereby enabling transistor 13 and interconnecting bitlines 7A and 7B, resulting in charge sharing of the reduced supply voltages carried thereon.

As shown in FIG. 2, the bitline voltages (BL) converge to a midpoint reference level voltages $V_{CC}$ and $V_{SS}$. However, since the bitline voltages were previously at levels reduced from the $V_{CC}$ and $V_{SS}$ levels, the time required for equalization of the bitline voltage levels is very short.

Next, the ØEQ2 signal returns to a logic low level disabling transistor 13, and the memory cell word line WL is activated (i.e. wordline 5 goes to a logic low level for enabling cell access transistor 3 to transfer charge from memory cell 1 to the bitline 7B).

For the purposes of illustration, it will be assumed that storage cell capacitor 1 contains a logic "0" charge which is transferred to bitline 7B. This results in a voltage differential between bitlines 7A and 7B since 7A was precharged to the mid-point reference level intermediate $V_{SS}$ and $V_{CC}$.

Next, the $\overline{ØS1}$ and $\overline{ØS2}$ signals go from logic high to logic low levels, thereby enabling transistors 17, 21 and 23 for applying a full logic high supply voltage ($V_{CC}$) to the source terminals of transistors 9A and 9B. The logic low level signal (i.e. from storage cell capacitor 1) carried by bitline 7B is applied to the gate terminal for enabling transistor 9A such that the voltage on bitline 7A rises to a full logic high value (transistor 9B remains off). Then, the ØR1 and ØR2 signals go from logic low to logic high levels for enabling transistors 19, 25 and 27, such that a full logic low supply voltage level ($V_{SS}$) is applied to the drain terminals of transistors 11A and 11B. With logic high and logic low level signals carried by bitlines 7A and 7B respectively, transistor 11B is enabled and transistor 11A remains off such that the logic low voltage level on bitline 7B is pulled down to a full logic low level while the logic high level on bitline 7A is retained. Accordingly, full logic high and logic low levels are applied to the DB and $\overline{DB}$ data busses via transistors 14 and 15, and a full logic low level is restored in capacitor 1.

Of course, at this time an opposite polarity data signal can be written into the access memory cell from data busses DB and $\overline{DB}$, in a well known manner.

Once the data has been read from the memory cell (1 and 3) at the end of the active cycle, the memory cell word line 5 is deactivated (i.e. rises to a logic high level), and the ØS2 and ØR2 signals go from logic low to logic high and logic high to logic low levels respectively, for disabling transistors 17 and 19. Next, the ØEQ1 signal goes to a logic high level for enabling transistor 29 such that a voltage divider is established between the $V_{CC}$ and $V_{SS}$ power sources via transistors 21, 23, 25, 27 and 29. Accordingly, the aforementioned reduced supply voltages ($V_{CC} - V_{TH}$ and $V_{SS} + V_{TH}$) are applied to the respective bitlines 7A and 7B via the enabled transistors and the sense and restore latches, respectively.

The ØEQ1 signal then returns to a logic low level, thereby disabling transistor 29, and the reduced supply voltages are maintained on the bitlines 7A and 7B for the remainder of the quiescent or precharge cycle until the next active cycle.

As discussed above, by maintaining reduced supply voltages on the bitlines during the precharge cycle, voltage stress on the sense and restore transistors 9A, 9B, 11A and 11B is substantially reduced, and the time required to equalize charge between the bitlines 7A and 7B at the start of the active cycle is also reduced, thereby overcoming the disadvantages of prior art devices.

An identical description of operation may be given for the circuit of FIG. 1 with a logic high data bit stored in the memory cell, the only difference being the relative polarities of bitlines 7A and 7B, and toggling of the sense and restore latches.

A person understanding the present invention may conceive of other embodiments or variations therein. For example, while the preferred embodiment utilizes a P-channel storage capacitor, N-channel sense cross-coupled latch and P-channel restore cross-coupled latch, the principles of the present invention may be applied to an N-channel storage capacitor with N-channel sensing latch and P-channel restore latch.

Also, whereas the preferred embodiment of the present invention is implemented within a folded bitline dynamic RAM, the principles of the invention (i.e. applying reduced supply voltages to the bitlines during the precharge cycle), may be advantageously applied to open bitline or any other configuration of bitline pairs within a dynamic RAM circuit.

All such embodiments or variations are believed to be within the sphere and scope of the present invention as defined in the claims appended hereto.

I claim:

1. A modified dynamic RAM circuit comprised of:
   (a) a plurality of memory cells for storing data therein,
   (b) a plurality of pairs of bitlines,
   (c) means or applying reduced high and low supply voltages to respective ones of said bitline pairs for precharging said bitlines, and thereafter ceasing application of said voltages,
   said full logic high and low supply voltages being approximately 5 volts and 0 volts respectively, and said reduced high and low supply voltages being approximately 3.8 volts and 0.8 volts respectively,
   (d) means for interconnecting respective bitlines of each of said bitline pairs for equalizing charge thereon, and thereafter disconnecting said respective bitlines,
   (e) means for connecting said plurality of memory cells to said respective bitlines for transferring said data onto said bitlines, and
   (f) means for applying full high and low supply voltages to said respective ones of said bitlines for sensing said data transferred thereto and for restoring said data in said memory cells,
   whereby applying said reduced supply voltages to said bitlines results in reduced voltage stress and quick data access.

2. A modified dynamic RAM circuit as defined in claim 1, wherein said means for applying reduced supply voltages to said bitlines is comprised of a pair of saturation mode field effect transistors connected to sources of said full high and low supply voltages, and via respective additional gate transistors to said respective bitlines, whereby said full supply voltages are reduced as a result of voltage drop across said saturation mode field effect transistors.

3. A method of accessing and refreshing data stored on one or more storage capacitors connected via corresponding cell access transistors to respective bitlines in a dynamic RAM circuit, during successive active and precharge operating cycles of said circuit, comprising the steps of:

(a) applying reduced high and low supply voltages which are less than and greater than said full high and low supply voltages, respectively, by an amount equal to the threshold voltage of a field effect transistor, to respective ones of said bitlines during said precharge cycle, (b) ceasing application of said reduced supply voltages to said bitlines and interconnecting said bitlines at the start of said active cycle, for equalizing charge on said bitlines, (c) connecting said cell access transistors to said bitlines for transferring said data from said storage capacitors to said bitlines and thereafter sensing said data transferred to said bitlines, whereby said data is accessed, (d) applying full high and low supply voltages to said respective bitlines for restoring said data on said storage capacitors, whereby said data is refreshed, and (e) disconnecting said cell access transistors from said bitlines at the end of said active cycle.

4. A method as defined in claim 3, wherein said full high and low supply voltages are approximately 5 volts and 0 volts respectively, and said reduced high and low supply voltages are approximately 3.8 volts and 0.8 volts respectively.

5. A modified dynamic RAM circuit as defined in claim 1, 2 or 3, wherein said means for applying full high and low supply voltages is comprised of:

(a) a pair of P-channel cross-coupled field effect transistors connected to said respective bitlines, (b) a further P-channel transistor for receiving an enable signal on a gate terminal thereof and in response interconnecting said full high supply voltage to said pair of cross-coupled transistors via a source-drain circuit path of said further transistor, for charging a predetermined bitline of each of said pairs of bitlines to said full logic high supply voltage, (c) a pair of N-channel cross-coupled field effect transistors connected to said respective bitlines, and (d) a further N-channel transistor for receiving an enable signal on a gate terminal thereof and in response interconnecting said full low supply voltage to said pair of N-channel cross-coupled transistors via a source drain circuit path of said further N-channel transistor, for charging the other bitline of each of said pairs of bitlines to said full logic low supply voltage, thereby creating an enhanced voltage differential across said respective bitline pairs.

6. In a dynamic RAM having one or more pairs of complementary bitlines, a circuit for connecting full and reduced logic high and low supply voltages to sense and restore latches connected to said bitlines, comprised of:

(a) a source of logic high supply voltage, (b) a source of logic low supply voltage, (c) a first P-channel transistor for connecting said source of logic high supply voltage to said sense latch during successive active cycles of said dynamic RAM;

(d) a first N-channel transistor for connecting said source of logic low supply voltage to said restore latch during said successive active cycles, (e) a second P-channel transistor for connecting said source of logic high supply voltage to said sense latch via a first load resistance during successive precharge cycles of said dynamic RAM, and (f) a second N-channel transistor for connecting said source of logic low supply voltage to said restore latch via a second load resistance during said successive precharge cycles.

7. A circuit as defined in claim 6, wherein said first load resistance is comprised of a third N-channel transistor having source and gate terminals connected to said source of logic high supply voltage, and a drain terminal connected to said second P-channel transistor.

8. A circuit as defined in claim 7, wherein said second load resistance is comprised of a fourth N-channel transistor having source and gate terminals connected to said second N-channel transistor and a drain terminal connected to said source of logic low supply voltage.

9. A circuit as defined in claim 6, 7 or 8, comprised of a further N-channel transistor for connecting said sense and restore latches during said precharge cycle.

* * * * *